United States Patent
Li et al.

(10) Patent No.: US 6,693,043 B1
(45) Date of Patent: Feb. 17, 2004

(54) METHOD FOR REMOVING PHOTORESIST FROM LOW-K FILMS IN A DOWNSTREAM PLASMA SYSTEM

(75) Inventors: Senzi Li, San Jose, CA (US); Helmuth Treichel, Milpitas, CA (US); Kirk Ostrowski, San Jose, CA (US); Chevan Goonetilleke, Hayward, CA (US); Jim Su, Cupertino, CA (US); David L. Chen, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/251,178

(22) Filed: Sep. 20, 2002

(51) Int. Cl.[7] ............... H01L 21/302; H01L 21/461
(52) U.S. Cl. .................. 438/725; 438/706
(58) Field of Search ................ 438/725, 723, 438/706, 710, 729; 216/63, 67; 156/345; 134/1

(56) References Cited

U.S. PATENT DOCUMENTS 5,795,831 A * 8/1998 Nakayama et al. ......... 438/714
5,908,319 A * 6/1999 Xu et al. .................... 438/725

(List continued on next page.)

FOREIGN PATENT DOCUMENTS

| WO | WO 02/29879 | 4/2001 |
| WO | WO 02/03426 | 1/2002 |

OTHER PUBLICATIONS

D. Nguyen, R. A. Shepherd, H.–C. Liou, G. Cerny, and M. Loboda, "Photoresist Removal Using Reducing Ash Chemistries for Low–k Application of HSQ Dielectric," presented at the AVS ICMI, 2nd International Conference on Advanced Materials and Processes for Microelectronics, Santa Clara, Feb. 10, 2000.

R. Shepherd, D. Nguyen, G. Cerny and M.J. Loboda, "Characterization of Ashing Effects on Low–k Dielectric Films," presented at the Electrochemical Society Spring Meeting, Toronto, May 16, 2000.

R. K.Laxman, N. H. Hendricks, B. Arkles, T. Tabler, "Synthesizing Low–k CVD Materials for Fab Use," Semiconductor International, Nov. 1, 2000.

W.W. Lee, "Integration Challenges of Low–k Materials," Future Fab, Vol. 8, Jul. 6, 2000.

R. H. Havemann, J. A. Hutchby, "High–Performance Interconnects: An Integration Overview," Proceedings of the IEEE, vol. 89, No. 5, May 2001, pp. 586–601.

D. Louis, E. Lajoinie, F. Pires, W. M. Lee, D. Homes, "Post Etch Cleaning of Low–k Dielectric Materials for Advanced Interconnects: Characterization and Process Optimization," Microelectronic Engineering, 41/42, 1998, p. 415–418.

J. Sjöberg, K. Rundgren, J. Osten–Sacken, R. Pompe, B. Larsson, "Nitridation of Silica with Ammonia: Some Important Features," Science of Ceramics 14, 1988, pp. 205–210.

(List continued on next page.)

*Primary Examiner*—Richard Elms
*Assistant Examiner*—Beth E. Owens
(74) *Attorney, Agent, or Firm*—Roland Tso

(57) ABSTRACT

A unique photoresist strip sequence using a downstream plasma system is described. The sequence can include a RF directional plasma alone, downstream plasma alone or combine both RF plasma and downstream plasma together. The process sequence can be a single step or multiple steps, which produce high strip rates while maintaining the dielectric properties of the film. The process can be an oxidizing process carried out at low temperature and low pressure, which reduces the reactivity of the oxygen with the low-k film. Furthermore, by adding a small percentage of an additive gas, such as a fluorine-containing gas, to the plasma, the inorganic residues from the strip process are removed, leaving a clean film cleared of photoresist and residue.

36 Claims, 5 Drawing Sheets

U.S. PATENT DOCUMENTS

| | | | | |
|---|---|---|---|---|
| 6,020,273 | A | 2/2000 | Cheng et al. | 438/782 |
| 6,028,015 | A | 2/2000 | Wang et al. | 438/789 |
| 6,114,259 | A | 9/2000 | Sukharev et al. | 438/789 |
| 6,204,192 | B1 | 3/2001 | Zhao et al. | 438/723 |
| 6,235,453 | B1 | 5/2001 | You et al. | 430/329 |

OTHER PUBLICATIONS

R. K. Brow and C.G. Pantano, "Thermochemical Nitridation of Microporous Silica Films in Ammonia," Journal of the American Ceramic Society, vol. 70, No. 1, Jan. 1987, pp. 9–14.

D. Nguyen, L. Forester, J. Kennedy, R. Burke, C. Cheng, "A Forming Gas Resist Strip Porcess for Use with Non–Etchback Low k Spin–on Polymers," Proceedings $13^{th}$ International VLSI Multilevel Interconnection Conference (VMIC), Santa Clara, CA, USA, Jun. 18–20, 1996, p. 147.

* cited by examiner

US 6,693,043 B1

METHOD FOR REMOVING PHOTORESIST FROM LOW-K FILMS IN A DOWNSTREAM PLASMA SYSTEM

FIELD OF THE INVENTION

The present invention relates to a process for making integrated circuit structures. More particularly, this invention relates to a process for removing a resist mask formed over a low dielectric constant material.

BACKGROUND OF THE INVENTION

In the continuing reduction of scale in integrated circuits, both the vertical and horizontal distances between metallic features such as interconnects, have shrunk. As a result, the capacitive coupling between such features has increased, with a resulting decrease in speed and increase in cross-talk between the interconnects. These effects adversely affect the performance of integrated circuits as the spacing decreases. For this reason, the search for lower dielectric constant materials to fill the spaces, has become a top priority.

Silicon oxide doped with carbon, as results from the binding of silicon with organic groups such as in methyl-doped silicon oxide, has a dielectric constant (k) of <3.0, compared to silicon dioxide at 4.0. While carbon-doped silicon materials can succeed in lowering the dielectric constants of layers formed from these materials, the carbon-silicon bond is not as strong as that of silicon-oxygen or silicon-hydrogen. As a result, these silicon-carbon bonds can easily be disrupted in subsequent processing, such as stripping of photoresist after an etch step.

Because of this sensitivity, it has been found to be necessary to provide thin barrier layers of conventional silicon dioxide below and above the layer of low-k materials, to protect the upper and lower surfaces from damage. While silicon dioxide has proved effective at protecting these surfaces, it cannot protect the newly formed side wall surfaces formed during the creation of vias or contact holes through the low-k film. Exposure of such side wall surfaces of the via formed in the low-k material can contribute to a phenomenon known as via poisoning, wherein conductive barrier material subsequently deposited in the via, such as tantalum nitride liner and copper filler material, fails to adhere to the via surfaces. These surfaces are particularly vulnerable to the resist strip process, the process used to remove the photoresist mask from the surface of the wafer.

In the removal of the photoresist mask using an $O_2$ plasma stripping process at high temperature such as 250° C., oxygen apparently attacks the Si—C and Si—H bonds. Thus, when the photoresist is removed with conventional stripping techniques, damage can occur to the newly formed and exposed low-k material surfaces. For this reason, considerable resources have been applied to research and development of reducing processes, rather than oxidizing processes, as reducing processes were thought to be gentler to the sensitive surfaces.

However, it has been found that reactive H formed by the reducing plasma carries enough energy to break down the low dielectric constant material and deplete carbon from the chemically less stable Si—C bonds, leaving unsaturated Si bonds behind or replacing the Si—C bonds with Si—H bonds. Unsaturated Si or Si—H bonds are very sensitive to $O_2$ or $H_2O$, as they readily react with $O_2$ or pick up moisture upon exposure to air after the process. The inclusion of even a small amount of water can have a significant effect on the dielectric constant of the film, as the dielectric constant of water is 80. Furthermore, absorption of water by the film can poison the vias. In this situation, the electrical resistance of the metal of the interconnect is greatly increased due to the chemical reaction of the water vapor with the metal being used to line or fill the holes. Therefore, a first disadvantage of reducing plasmas is the creation of reactive bond sites which can bind water molecules which subsequently poison the vias.

A second disadvantage of the reducing chemistry plasmas is the lower strip rate. Typical low-k strip processes for organo-silicate glasses (OSGs) include an $H_2$ base, either via ammonia $NH_3$, hydrogen $H_2$, $H_2$ and $N_2$, or $H_2O$ vapor. The strip rates of these processes are relatively slow, 100–200 nm/minute. The lower strip rate increases the processing time that the wafer is exposed to the plasma, which may cause further deterioration of the low-k material However, the biggest disadvantage of the reducing chemistry plasma may be the measured increase in dielectric constant of the films processed with a reducing chemistry. One of the factors contributing to the bigger dielectric constant shifts appears to be that the exposed Si—O or Si—C bonds react with N radicals or ions in an N-containing plasma to form Si oxynitrides or nitrides, with the activation energy supplied by heat, laser or plasma. The dielectric constant of $Si_3N_4$ is 7 and that Of $SiO_2$ is 4. A secondary effect occurs for reducing chemistry plasmas using hydrogen, in that many materials, and porous low-k dielectric films in particular, are more permeable to hydrogen than to oxygen. Hydrogen may therefore penetrate the low-k dielectrics more deeply and attack Si—C bonds in a more extensive manner under plasma conditions, causing a higher dielectric constant shift compared to O-containing chemistries.

However, oxidizing chemistries at high temperature were considered to be too aggressive for the fragile low-k material and have had limited application in the low-k related stripping processes. Because oxygen reacts readily with the organic materials of the photoresist, it was anticipated that oxidizing chemistries would react aggressively with the organo-silicate materials.

SUMMARY

The invention relates to a dry plasma cleaning process for post-etch photoresist stripping and residue removal from a wafer that includes at least one layer of low-k dielectric material. The invention makes use of a downstream plasma in a dual power system to reduce the dielectric constant shift of the low-k film.

The invention makes use of multiple process steps, to carry out different aspects of the invention. In a first step, the hardened crust layer is removed and the bulk photoresist is stripped. In a subsequent step, the remaining film is treated to remove residues or a damaged layer, or otherwise repair the damage left by the first step of the invention.

In some embodiments of the present invention, the photoresist mask is stripped by oxidizing plasma at low temperature and low pressure in a downstream plasma system, to reduce damage to underlying low-k material. In some other embodiments of the present invention, the oxidizing gas is a mixture of $O_2$ with a small percentage of a fluorine-containing compound, such as $CF_4$. The fluorine-containing gas reacts with the trace metal and inorganic contaminants that are left over from the etch process.

The low temperature may avoid excessive depletion of the carbon and organic dopants in the silicon film, by reducing the diffusion of oxygen into the low-k dielectric layers. The low temperature may also reduce oxidation of the copper interconnects. Lastly, the low pressure reduces the possible alteration of the sidewalls of the low-k dielectric material due to ion or radical scattering. By avoiding the use of hydrogen in the plasma, any damage that occurs is in a thin boundary layer at the surface of the film. The damaged layer may subsequently be removed in the second treatment step, as will be described below.

In a first embodiment of the invention, a dual source tool is used, with downstream plasma in addition to the usual RF plasma. The downstream plasma source provides a higher density of radicals to form a densified layer on the low-k material, which protects the material from subsequent reaction with ambient contaminants. The downstream plasma radicals also promote a substantially uniform photoresist strip, especially on the top surface. As a result, the k-shift associated with damage from longer processing time may be reduced.

The invention is found to yield clean surfaces which have been cleared of photoresist and residue, yet the dielectric constants of the low-k films remain lower than those generated by reducing chemistry plasmas. In fact, the oxidizing chemistries of this invention yield low-k materials with dielectric constants on the order of 0.2 to 0.5 lower than those yielded by reducing chemistry plasmas. In addition, the invention provides higher strip rates, up to the order of 1 $\mu$m/minute, compared to reducing chemistries which strip resist at a rate of 100–250 nm/minute. The shorter processing time may also be responsible for the improved dielectric constant results, as the duration of exposure to the plasma is reduced.

DETAILED DESCRIPTION

Figure 1:
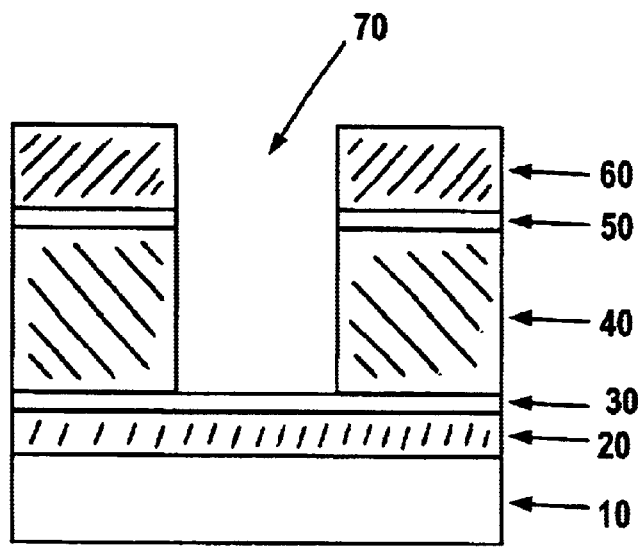
FIG. 1 is a diagrammatic view of a portion of an exemplary integrated circuit device.

FIG. 1 is a portion of an exemplary integrated circuit device upon which the invention may be practiced. A substrate 10 is provided which has been previously covered with a layer of copper 20 and silicon carbide 30, which will form the metal interconnect layers for the device. The metal interconnect layers 20, 30 are covered with an organo-silicate low-k dielectric material 40 which will insulate the copper and silicon carbide layers from subsequently deposited metal layers. The low-k dielectric layer is then coated with a layer of bottom anti-reflection coating 50, and photoresist 60. An exemplary thickness of the anti-reflection coating 50 is 75 nm and the resist 60 may be, for example, 0.5 $\mu$m thick. A via 70 has been etched through the dielectric layer 40, according to the pattern in the photoresist 60. The via 70 will subsequently be filled with a conductive material to provide electrical access to the silicon carbide and copper layers lying beneath the dielectric layer 40.

After formation of the via 70, it is desired to remove the photoresist 60 without deleteriously affecting the low-k dielectric layer 40 on the substrate 10. Since this dielectric material is organic, it has some chemical similarity with the photoresist, so that processes applied to strip the photoresist will often attack the low-k film as well. It is desirable to reduce or minimize this damage to the low-k film 40, while maintaining a strip rate that is economically viable, for example, at about 1 $\mu$m/minute. It may be important for the walls of the via 70 to be protected, since if they are left with chemically reactive sites, they can absorb moisture upon exposure to ambient conditions. This moisture may be released upon subsequent heat treatments, such as deposition of the metal in the vias, whereupon it may interact with the metal to form highly resistive metal oxides.

Figure 2:
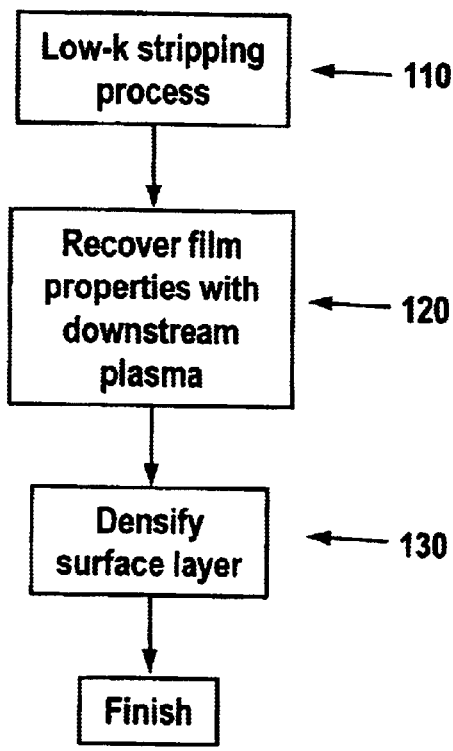
FIG. 2 is a simplified flow chart of the process according to an embodiment of the present invention.

A simplified process flow is shown in FIG. 2. First the substrate is exposed 110 to an oxidizing chemistry plasma which performs most of the photoresist stripping. Then, the substrate is exposed to a downstream plasma 120 in order to improve a property of the low-k film, which was altered by the first exposing 110. Here, improving a property means, for example, reducing or minimizing the dielectric constant shift of the low-k film, which was shifted upward by the first exposing. Optionally, the substrate can further be exposed 130 to a RF and/or a downstream plasma to further reduce the shift in the dielectric constant after exposing the wafer to air.

Various dual source plasma systems can be used in connection with the process described in FIG. 2. Two such products, bearing the trademarks GAMMA™ and PEP IRIDIA™, respectively, are commercially available from Novellus, Inc. of San Jose, Calif.

Figure 3:
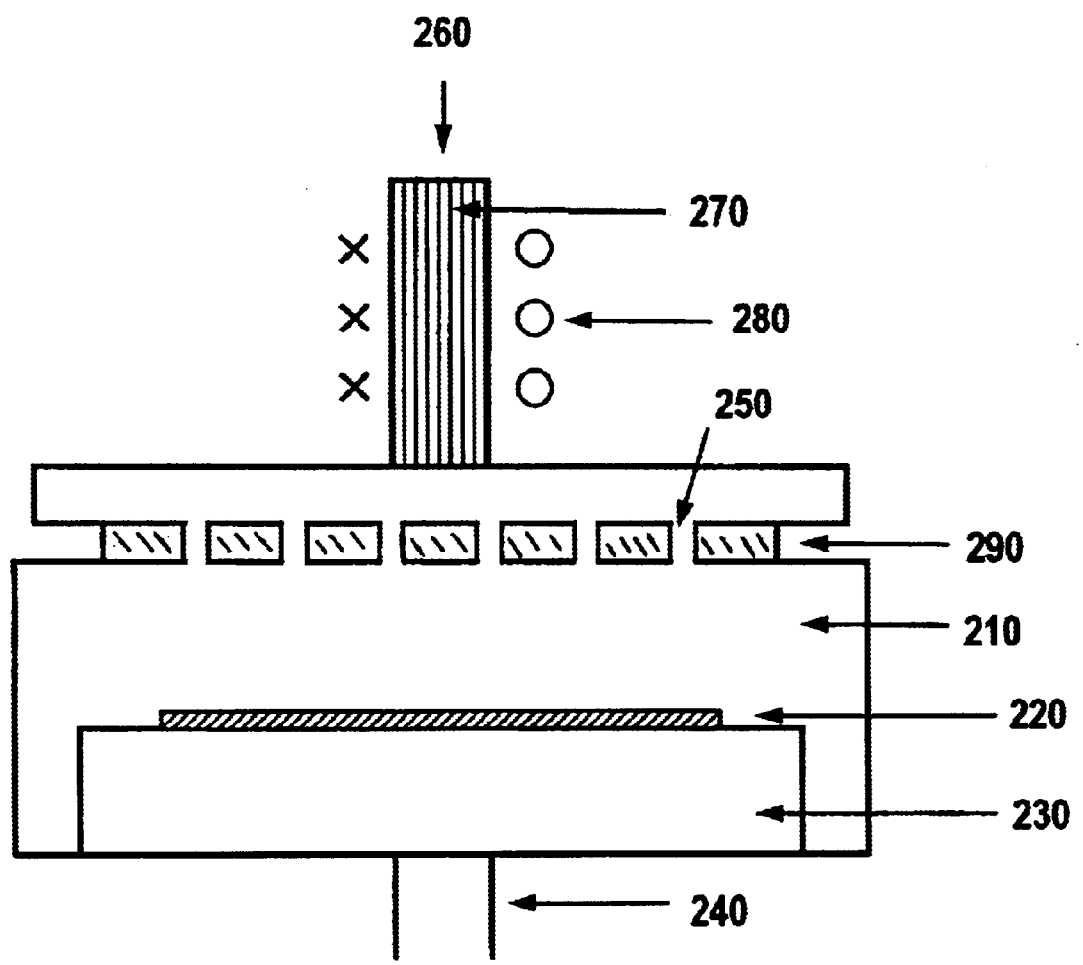
FIG. 3 is a simplified schematic diagram of a downstream plasma resist removal chamber, equipped with an inductively coupled plasma source for the downstream plasma.

Both tools have the advantageous feature of having dual sources, a RF plasma source and a downstream plasma source operatively connected to the resist removal chamber. These products are convenient for the application of this invention, as the different process conditions can be applied within the same tool. A schematic diagram of the GAMMA dual source plasma system is shown in FIG. 3. Resist removal chamber 210 contains the substrate 220 supported on a platen 230. The platen 230 is supported on a pedestal 240 which holds the substrate beneath the inlet via 250 from the downstream source 260. The platen is coupled to a heat source (not shown) to provide heat for the substrate. The platen 230 is electrically connected to the RF source 290 via the pedestal 240 which supplies radio frequency power to the platen.

A plasma gas is supplied to the chamber through a number of vacuum fittings (not shown). The oscillating fields applied by the RF source 290 to platen 230 accelerate ions in the gas, causing them to collide with neutral species, ionizing the neutral species in turn, until a plasma is formed above the substrate 220 on the platen 230. Vacuum plumbing (not shown) is applied to the resist removal chamber to allow the evacuation of the chamber to the required levels. The RF power supply is capable of delivering up to 1000W per wafer to the plasma.

The downstream source, which in this example is an inductively coupled plasma (ICP) source 260, ionizes a gas in a separate chamber 270 operatively connected to the resist removal chamber 210 which contains the platen 230 and substrate 220. Alternatively, other downstream plasma sources may be used. The ICP source can deliver up to about 3000W per wafer to the downstream plasma. A radio frequency generator produces an oscillating current in an induction coil 280 that wraps around the downstream plasma chamber 270. The induction coil creates an oscillating magnetic field, which in turn sets up an oscillating current in the ions and electrons of the gas. These ions and electrons transfer energy to other atoms in the gas by collisions to create a plasma.

The plasma gases are routed downstream under vacuum flow, and cross a neutralizing barrier 290 at the entrance inlet via 250 to the resist removal chamber 210. The neutralizing barrier 290 could be a grounded metallic grid or ungrounded dielectric grid which presents a large surface area to the incoming gas. Collisions between the ionized gas species and the neutralizing barrier neutralizes the ions, through recombination, such that the flow into the resist removal chamber comprises mainly neutral species and reactive radicals.

The two plasma sources generate plasmas, which differ qualitatively one from the other, in composition and in effect on the substrate. The RF or direct plasma is responsible for most of the anisotropic etching of the photoresist by ions accelerated in the plasma. The ions are accelerated towards the wafer surface at directions substantially perpendicular to the plane of the wafer, and thus they travel parallel to, or nearly parallel to the vertical surfaces of the low-k material comprising the sidewalls of the vias. Consequently, the ions impinge on the vertical surfaces much less frequently than on the horizontal surfaces that are parallel to the wafer plane, and when they do strike the sidewall, they do so at grazing incidence. Charged ions bombard the horizontal surfaces with full intensity at or near normal incidence. The interactions between the substrate surface and the RF plasma products are therefore mainly ballistic, whereas in the case of the downstream source, they are mainly chemical. Since ion bombardment is minimal on the vertical surfaces, reactions rates on the low-k surfaces are relatively low and, as a result, the etch rate is highly anisotropic.

In contrast, the downstream source is primarily responsible for the creation of a densified layer on the sidewalls of the low-k material, which will reduce or minimize the dielectric constant shift. The densified layer results from the chemical interactions between the organic silicates and the energized radicals from the downstream plasma. The downstream source also provides a higher density of radicals to ensure uniform photoresist strip, especially on the top surface. As a result, the k-shift associated with damage from longer processing time may be reduced. In addition, the charging and UV radiation damage commonly seen in many etching tools can be reduced or avoided by using the downstream plasma. Lastly, the sources can be operated independently, so that steps calling for purely RF plasma or purely downstream plasma can be accommodated within the same tool. Both the downstream plasma source and the direct RF source have an output power capability of about 3000W per wafer. Adding downstream plasma to the RF plasma has the potential to enhance the photoresist strip rate, and thereby reduce the exposure time of the wafer to the plasma.

According to the flow chart of FIG. 2, the substrate is inserted into a resist removal chamber, where it is supported on the platen. First, an oxygen-containing gas is supplied 110 to the resist removal chamber at a flow rate of 5–5000 sccm (standard cubic centimeters per minute) per wafer, or preferably between 5–300 sccm per wafer, or more preferably about 200 sccm per wafer. In addition to the $O_2$, a diluent gas is supplied to the chamber at a flow rate of 50–500 sccm. The diluent gas can be nitrogen, helium, argon, neon, or xenon, or hydrogen. The diluent gas may also be forming gas, which contains about 96% nitrogen and 4% hydrogen. In general, the proportion of $O_2$ in the oxygen-containing gas is about 0.1 to 100%, preferably about 10–50%, or more preferably about 25%. The presence of the diluent gas helps to maintain stable plasma. In some embodiments, the chamber pressure can be 10–500 mTorr, and in this embodiment, the total chamber pressure is preferably about 150–300 mTorr.

The oxygen-containing gas may, in some embodiments, further contain an additive gas such as $C_xH_yF_x$, $CF_4$, $NF_3$ or $NH_3$, in a small volume percentage such as 0.1% to 5%. The additive gas may help to de-skin, or remove the hard crust layer formed over the photoresist by the previous processing steps.

The RF power is applied at a level of about 50 to 1000 W per wafer, preferably about 100–600 W per wafer, and more preferably at about 150 W per wafer, to ignite plasma in the chamber located just above the surface of the substrate. It is believed that the RF plasma is primarily responsible for the rapid removal of the photoresist film, because it accelerates ions at nearly normal incidence into the surface of the substrate. The exposure time for the wafer in the chamber is less than about 60 seconds, and preferably 20–60 seconds. The etch rate achieved in these conditions is about 0.5 $\mu$m per minute to about 1 $\mu$m per minute. Therefore, the first step in this embodiment removes most of the photoresist from the low-k film. The output power applied to the downstream plasma is from about 100W to about 3000W per wafer, and preferably about 100W per wafer.

The oxygen-containing plasma can be used not only to strip the photoresist film via the RF plasma, but also to react with a shallow layer of the low-k dielectric, in order to densify the material in a 20–30 nm layer, via the downstream plasma. The densified layer comprises a portion of $SiO_2$, which provides an effective barrier to subsequent absorption of moisture and other reactive contaminants. Therefore, the behavior of films, which have been exposed to the oxidizing chemistry plasmas, differs from those, subjected to reducing chemistry plasmas. For the reducing case, the barrier layer is not formed, and the films subsequently absorb water, causing the dielectric constant to rise steadily as a function of time after the stripping process. Films subjected to the oxygen-chemistry plasma show relatively little degradation of the dielectric constant with time, but instead retain a slightly increased dielectric constant, indefinitely after processing.

The low temperature and low pressure are useful features of the invention, because they reduce the damaging effects of oxygen on the dielectric film. In particular, the low temperature reduces the penetration of oxygen into the films, where it would otherwise displace the Si—C bonds to form the thermodynamically more stable Si—$O_2$ bonds. The low temperature also reduces the oxidation rate of the exposed copper surfaces, and the damage to the via or trench sidewalls due to ion scattering. Therefore, a process parameter used in this invention is the maintenance of the substrate temperature of 20–100° C., or preferably, at or below 60° C.

The low-pressure conditions enhance the anisotropic reaction of reactive ions or radicals with the photoresist, while reducing the possible alteration of the sidewall of the low-k dielectric materials due to ion or radical scattering.

As shown in FIG. 2, a treatment 120 is applied to the substrate, which mitigates the damaging effects of the oxygen plasma. The treatment 120 often, though not always, involves the downstream plasma source. The treatment may alternatively remove a layer of residue, or a layer of damage, or may simply anneal the film, to improve its performance characteristics. The details of the process conditions may be fine-tuned to accomplish the intended goal of the treatment 120. The choice of direct RF and/or downstream plasma may depend on the intent of the treatment 120.

In an exemplary embodiment, the treatment 120 may use a gas mixture comprising 1000 sccm per wafer of $O_2$ with or without an inert gas, and 5 sccm per wafer of an additive gas, applied to the chamber at 300 mTorr total chamber pressure. The additive gas may be a fluorine-containing gas such as $CF_4$, or in some other embodiments the additive gas may be $C_xH_yF_z$, $NF_3$ or $NH_3$. In yet another embodiment, the gas may contain $C_xH_ySi_aO_b$ with x ranging from 4 to 8, y ranging from 12 to 24, a ranging from 1 to 4, and b ranging from 1 to 4, for example hexamethyldisiloxane $C_6H_{18}SiO_2$. The proportion of additive gas in the gas mixture is 0.1% to 5%, or preferably 0.5% to 2%, or more preferably 0.5%. The additive gas, at least in the case of hexamethyldisiloxane, may help remethylize the low-k material, and return its dielectric constant to its value before the oxidizing strip process 110. In the case of the fluorinated gases, the additive gas may be used to break up the inorganic constituents of the residue, which may form on the film as a result of the interaction with the oxidizing gas 110. However, because in general the additive gas, such as $CF_4$, is highly corrosive, exposure time may be limited to the minimum required to clean the surfaces, while maintaining the critical dimensions of the devices.

A RF plasma is applied in combination with downstream plasma, with the RF power at 100W to 500W per wafer, preferably about 150W per wafer and the downstream ICP source at 100W to 500W per wafer, preferably about 100W per wafer. The substrate is exposed to the plasma for less than 90 seconds, or preferably for about 20–60 seconds, or more preferably about 40 seconds.

While an exemplary embodiment has been described herein, a variety of process parameters is available for application of the invention. For example, treatment 120 can be essentially an annealing step (or surface densification step) at high temperature, for example from about 150° C. to 400° C., with or without RF and downstream plasmas applied. Alternatively, another embodiment can be a low temperature, e.g. about 10° C. to about 150° C., RF and downstream plasma step which may remove residue left over from the bulk stripping of the photoresist. The purpose of the treatment 120 however, is to improve a property of the low-k film which was altered or damaged by the first step.

Figure 4:
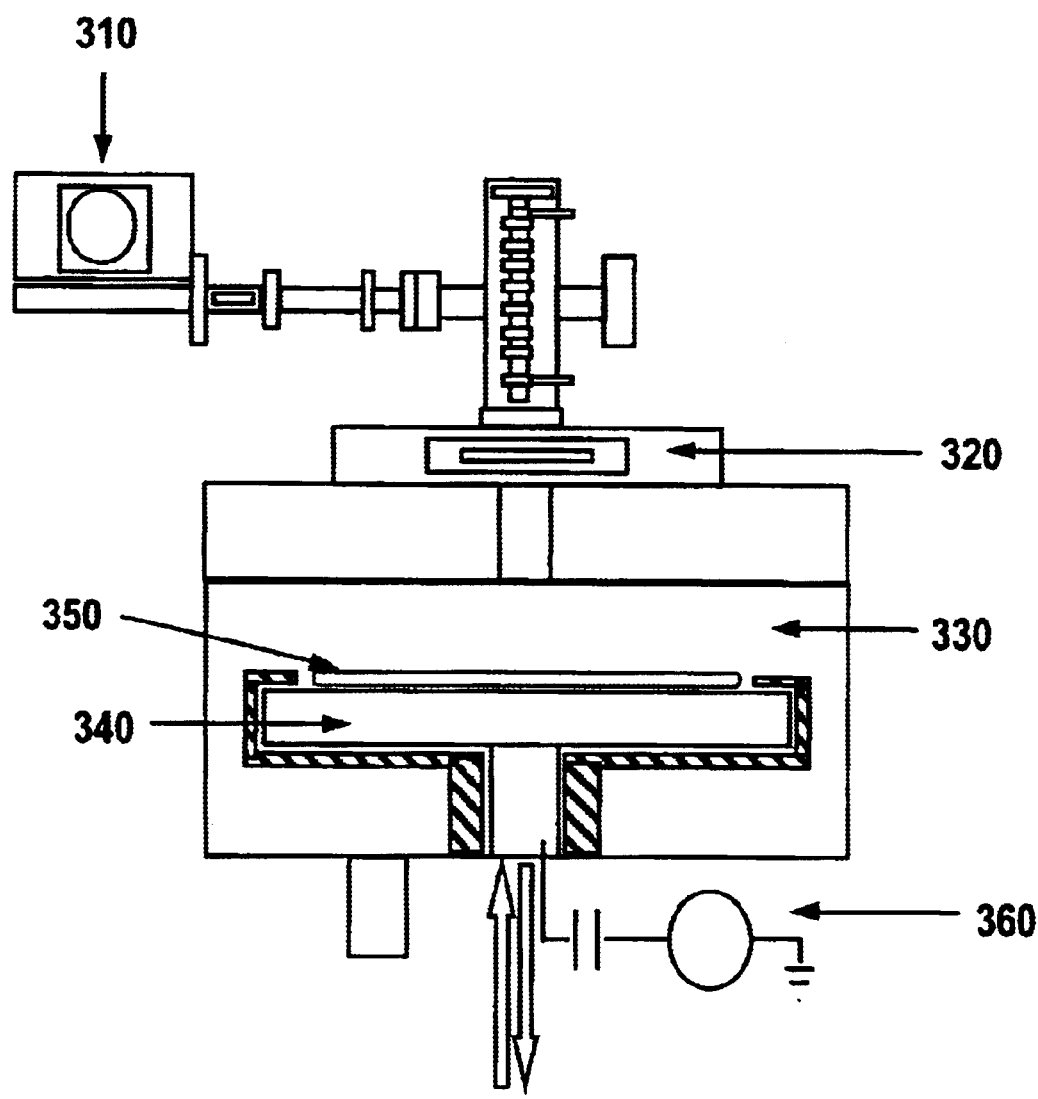
FIG. 4 is a simplified schematic diagram of a downstream plasma resist removal chamber equipped with a microwave source for the downstream plasma.

In a second embodiment of FIG. 2, another dual source plasma system is used, this time containing a RF direct bias plasma source and a microwave downstream plasma source. The tool is shown schematically in FIG. 4. The microwave downstream source 310 is similar to the ICP source in the preceding example. The downstream plasma gases must cross a gas distribution plate, the neutralizing barrier 320 between the source 310 and the vacuum chamber 330. The neutralizing barrier 320 is the recombination mechanism, which neutralizes the gases before they go into the vacuum chamber 330. The neutralizing barrier 320 removes most of the ionized species from the plasma, leaving it with fewer than 1e10 ions/cm . The plasma therefore contains mostly reactive radical species, which will undergo chemical reactions with the exposed surfaces on the substrate. Again in this tool, the substrate 350 is supported on a platen 340, which is supplied with RF power 360. The downstream microwave plasma sources, as well as the direct RF plasma source, have a total output power capability of up to about 3000W per wafer.

In the photoresist-removing portion 110 of this embodiment, the plasma gas is a mixture of a primary oxidizing gas with a small (<2%) concentration of an additive gas. The additive gas may be $CF_4$, $NH_3$, $NF_3$, or $C_xH_yF_z$. In this embodiment therefore, the additive gas is applied in the photoresist-removing portion, to remove residues left over from the etch process, or those being formed simultaneously by the oxidizing plasma. The concentration of the additive gas species is on the order of 0.1–5%, and preferably 1–2%, more preferably about 1.5%, and supplied to the chamber at a flow rate of 0.5–3.0 sccm per wafer, with the $O_2$ supplied at 200 sccm per wafer, and at a total chamber pressure of 10 mTorr to 2000 mTorr, or preferably about 200 mTorr. The duration of the exposure of the wafer to this gas is limited to less than 90 seconds, and preferably 30–40 seconds. Therefore the first step cleans the etch residues but leaves a layer of damage which could be up to 60 nm thick.

The primary oxidizing gas may also include any of a number of diluent gases, such as nitrogen, argon, xenon, helium or neon. It may also include hydrogen, or forming gas, which is a mixture of about 96% nitrogen and 4% hydrogen. The proportion of oxygen in the primary oxidizing gas may be from 0.1% to 99%, or preferably about 10% to about 50%, or more preferably about 25%.

For the photoresist-removing portion 110 of this embodiment, the RF source is applied at a level of about 50 to 1000W per wafer and is normally activated at a level of 100W to 600W per wafer, or preferably about 450W per wafer of bias power, yielding an etch rate of 0.60 μm/minute and less than 4% nonuniformity (1 σ with 6 mm edge exclusion). The downstream microwave source is activated at 100W per wafer output power, although the downstream power source is capable of supplying up to 3000W per wafer.

The treatment portion 120 of this embodiment is the exposure of the wafer to another oxidizing gas such as $O_2$, which performs further stripping of the photoresist, removing the damaged layer, and densifying the surface layers of the low-k material. In this embodiment, oxygen is mixed with an inert gas and supplied to the chamber at a rate of about 50 to 1000 sccm per wafer, preferably 200 sccm per wafer, and at a total chamber pressure of about 10 to 2000 mTorr, preferably about 150–300 mTorr. The proportion of oxygen in the gas is about 0.1% to 100%, or preferably about 10–50%, or more preferably about 25%. RF bias power only is applied in this embodiment, with an output power of about 450W per wafer. The exposure takes place at a temperature of about 60° C., for a period of less than 90 seconds, or preferably 40–50 seconds. For the process parameters described here, the photoresist removal rate was on the order of 0.58 μm/minute, with less than 3% nonuniformity (1 σ with 6 mm edge exclusion).

Figure 5:
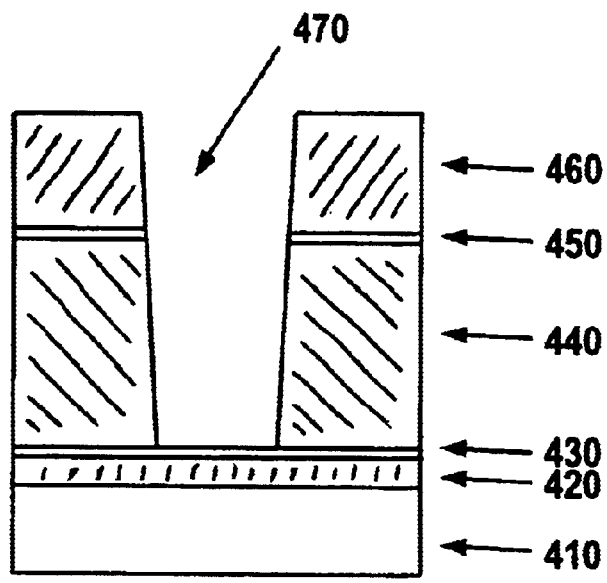
FIG. 5 shows a portion of an integrated circuit device, before the photoresist strip process is applied.

FIG. 5 is an SEM cross section of the device shown diagrammatically in FIG. 1. The wafer is shown prior to application of the stripping process as described herein. The first layer 410 is the substrate, the next layer 420 is the copper interconnect layer, followed by a layer 430 of silicon carbide. The via hole 470 has been formed through the low-k dielectric layer 440, a bottom anti-reflection coating layer 450, and a top photoresist layer 460. The figure shows the device before processing, in which the photoresist 460, bottom anti-reflection coating 450 and low-k dielectric layer 440 are visible in the contours of the side walls of the via 470.

Figure 6:
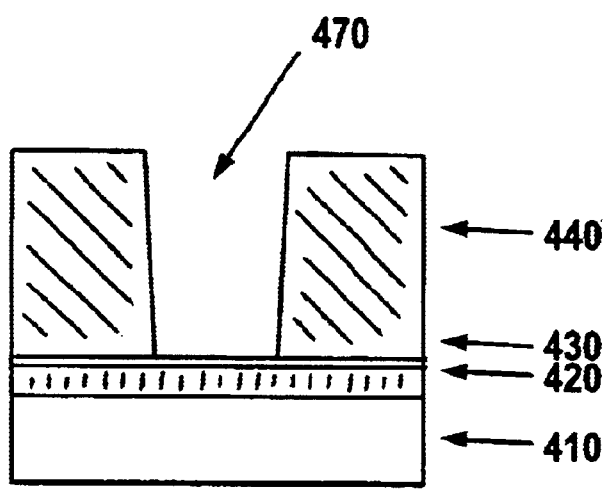
FIG. 6 shows a portion of an integrated circuit device, after application of the photoresist strip process according to an embodiment of this invention.

FIG. 6 is an SEM cross-section image of the device after processing according to an embodiment of the present invention. The process conditions for this example were 200 sccm of $O_2$ with 3 sccm of $CF_4$, at 200 mTorr chamber pressure. The RF power to the plasma was 450W per wafer, and the substrate was maintained at a temperature of 60° C. for a total of 80 seconds of exposure to the plasma. The total amount of resist removed in this embodiment was 800 nm. As can be seen in the image, the photoresist 460 (in FIG. 5) and bottom anti-reflection coating 450 (in FIG. 5) layers have been cleanly removed from the via holes 470, leaving the low-k dielectric layer 440 undamaged.

Figure 7:
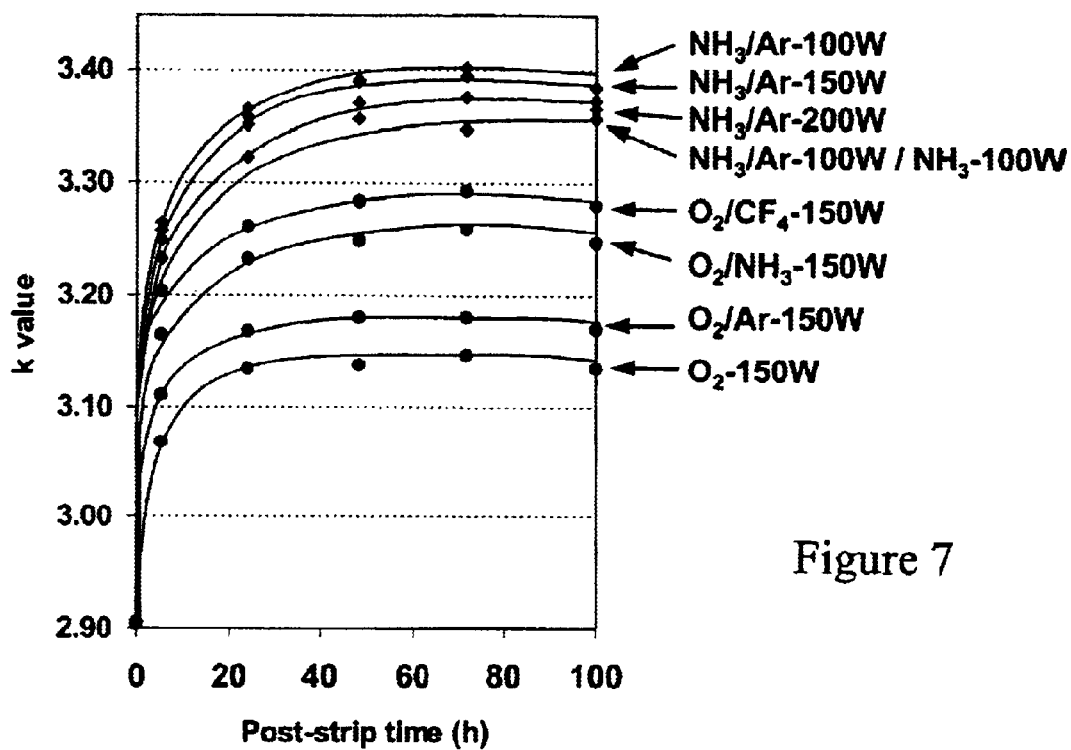
FIG. 7 shows data from measurements of the dielectric constant of a number of films, which have been processed in accordance with this invention, as compared to the films processed according to the prior art.

To demonstrate the effect of the oxidizing plasmas on the dielectric constants of the films, a variety of oxidizing plasmas were applied to substrate samples, and the dielectric constant was measured after processing. FIG. 7 summarizes the data collected, comparing the oxidizing chemistry of the present invention to the reducing chemistry of the prior art. In the figure, the dielectric constant is plotted as a function of time, all starting from initial k value of 2.9 in the as-received state. The top four sets of data, designated 710–740, and identified in the legend as having the diamond-shaped data points, correspond to the prior art, which is an ammonia reducing plasma, combined with an inert gas, at 100–200 W per wafer of RF power. The typical dielectric constant rise seen in the data is 0.35 to 0.40 over the 100 hour span. In contrast, the k values after using oxidizing chemistries are all below 3.30 and as low as 3.15.

Figure 8:
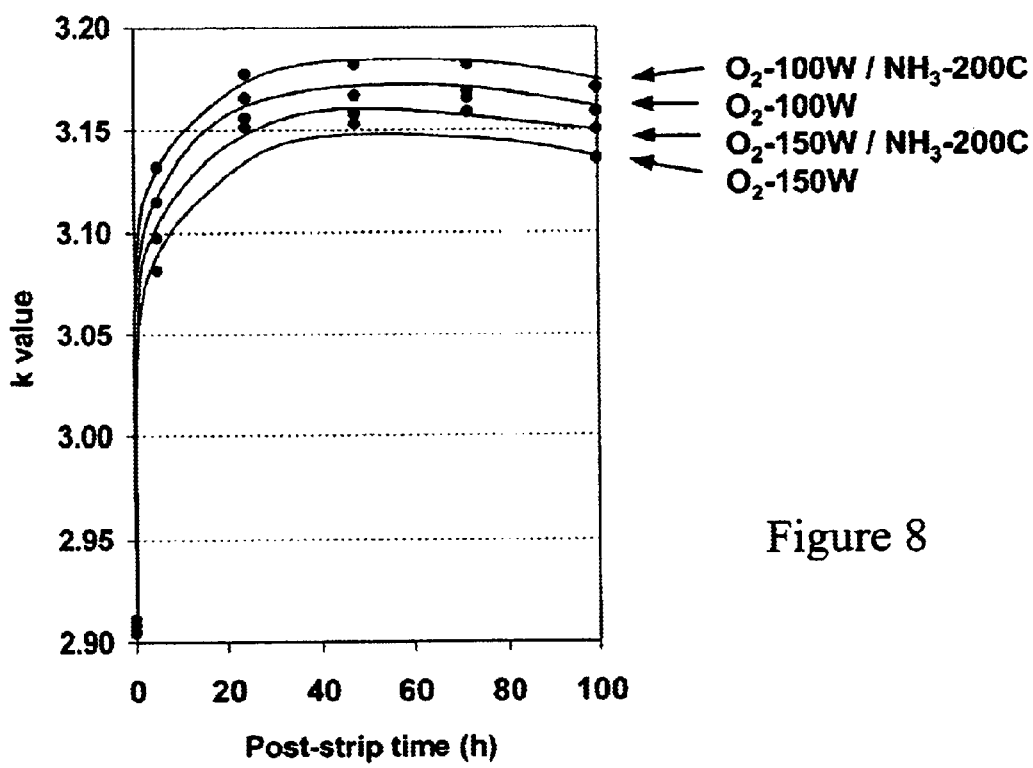
FIG. 8 shows data from measurements of the dielectric constant of a number of films, which have been processed in accordance with this invention, as compared to the films processed according to the prior art.

In some embodiments, the second step of the process involves high temperature with gas only (no plasma), or downstream plasma only. In this case the second step is largely an annealing, or surface densifying step, and not a material removal step. FIG. 8 shows the effect of the annealing process on the dielectric constant of the film. Data sets 750 and 770 correspond to a film stripped in $O_2$ with 100W per wafer direct RF plasma and 150W direct RF plasma, respectively. The data sets 760 and 780 correspond to the same strip conditions, but with an additional downstream annealing step under $NH_3$ and at 200° C. Each of the curves shows a slight reduction in the dielectric constant for the case with the high temperature anneal, compared to the case with the RF plasma alone. The reduction in dielectric constant can be seen from the data to be on the order of 0.01. Therefore the data indicates that the annealing step further improves, although slightly, the dielectric constant of the resulting films. Overall, the data show that low temperature, low pressure oxidizing plasmas in a downstream plasma system, can be effective in cleanly removing a layer of photoresist, while leaving the dielectric properties of the low-k dielectric film intact.

The invention is not limited to the embodiments described above. For instance, the invention is not limited to the particular dielectric materials or process parameters, layer thicknesses, or other details. Likewise, the invention is not limited to the particular shape of the vias or their positioning relative to each other, and the invention is not limited to particular materials or tool designs. For example, silicon substrate 10 can be replaced with polysilicon, amorphous silicon, monocrystalline silicon, or their combinations. The order of the steps described in the exemplary embodiments can be altered, and additional steps can be added. The process sequence can be tailored depending on the nature of the low-k films and the structure of film stacks. Other embodiments and variations within the scope of the invention, as defined by the appended claims, will occur to practitioners in view of the disclosure herein.

What is claimed is:

1. A method for removing photoresist from a substrate having a layer of material having a low dielectric constant thereon, comprising:

exposing the photoresist on the substrate having the low dielectric constant layer to an oxidizing, oxygen-containing plasma from a direct plasma source and a downstream plasma source in a downstream plasma system, a substrate temperature being about 10 to about 400° C. and a chamber pressure being about 10 to about 2000 mTorr.

2. The method as in claim 1, wherein the plasma comprises from about 0.1% to about 100% oxygen.

3. The method as in claim 1, wherein the plasma comprises oxygen and a gas selected from a group consisting of nitrogen, hydrogen, argon, helium, xenon, neon, and any combination thereof.

4. The method of claim 1, wherein the plasma comprises oxygen with a forming gas, the forming gas having a composition of about 96% nitrogen and about 4% hydrogen.

5. The method of any one of claims 3–4, wherein the plasma comprises from about 10% to about 50% oxygen.

6. The method of claim 5, wherein oxygen is supplied at a rate of about 5 sccm to about 5000 sccm per wafer.

7. The method of claim 1, wherein the chamber pressure is from about 10 to about 500 mTorr.

8. The method of claim 1, wherein the chamber pressure is about 150 to about 300 mTorr.

9. The method of claim 1, wherein the substrate temperature is about 10° C. to about 100° C.

10. The method of claim 1, wherein the downstream plasma source is a microwave source or an inductively coupled plasma source.

11. The method of claim 1, wherein the downstream plasma source has an output power in the range of up to about 3000W per wafer.

12. The method of claim 1, wherein the direct plasma source is a radio frequency power source having an output of up to about 1000W per wafer.

13. A method for removing photoresist from a substrate in a downstream plasma system, the substrate having a layer of a material of low dielectric constant thereon, the method comprising:

first exposing the substrate having the low dielectric constant layer to an oxygen-containing plasma formed by a direct plasma source and a downstream plasma source, the plasma comprising a first gas to strip the photoresist; and subsequently exposing the substrate having the low dielectric constant layer to a second gas, to improve a dielectric film property altered by the first exposing.

14. The method of claim 13, wherein the subsequent exposing comprises maintaining the substrate at a temperature of about 10° C. to about 400° C.

15. The method of claim 13, wherein the first gas comprises oxygen and a gas selected from the group consisting of nitrogen, hydrogen, argon, helium, xenon, neon, and any combination thereof.

16. The method of claim 13, wherein the first gas comprises oxygen and a gas selected from a group consisting of $C_xH_yF_z$, $CF_4$, $NF_3$ and $NH_3$.

17. The method of claim 13, wherein the first gas comprises an inert gas and a gas selected from a group consisting of $C_xH_yF_z$, $CF_4$, $NF_3$ and $NH_3$.

18. The method of claim 13, wherein the second gas comprises oxygen and a gas selected from a group consisting of $C_xH_yF_z$, $CF_4$, $NF_3$ and $NH_3$.

19. The method of claim 13, wherein the second gas comprises an inert gas and a gas selected from a group consisting of $C_xH_yF_z$, $CF_4$, $NF_3$ and $NH_3$.

20. The method of claim 13, wherein the second gas comprises $C_xH_ySi_aO_b$ with x ranging from 4 to 8, y ranging from 12 to 24, a ranging from 1 to 4, and b ranging from 1 to 4.

21. The method of claim 20, wherein the $C_xH_ySi_aO_b$ is hexamethyldisiloxane.

22. The method of claim 13, wherein the first exposing comprises exposing the substrate to a direct plasma from a radio frequency power source having an output of about 50W to about 1000W per wafer.

23. The method of claim 13, wherein the first exposing comprises exposing the substrate to a plasma from a direct plasma source and downstream plasma source, with a combined output power of up to about 3000W per wafer.

24. The method of claim 13, wherein the first exposing further comprises maintaining a substrate temperature of less than about 150° C.

25. The method of claim 13, wherein the subsequent exposing comprises exposing the substrate to a direct plasma from a radio frequency power source with an output of about 50W to about 1000W per wafer.

26. The method of claim 25, wherein the subsequent exposing comprises maintaining the substrate at a temperature of less than about 150° C.

27. The method of claim 13, wherein the subsequent exposing comprises exposing the substrate to a downstream plasma from a downstream plasma source having an output power in a range of up to about 3000W per wafer.

28. The method of claim 13, further comprising a third exposing wherein the substrate is exposed to an oxygen-containing direct plasma at a temperature less than about 150° C.

29. A method for removing photoresist from a substrate having a layer of a material of low dielectric constant thereon, comprising:

exposing the substrate having the low dielectric constant layer to a plasma from a direct plasma source and a downstream plasma source in a downstream plasma system, the plasma comprising about 0.1% to about 5% of an additive gas and a primary gas, with a substrate temperature being about 10 to about 90° C. and a chamber pressure of about 10 to about 2000 mTorr.

30. The method of claim 29, wherein the primary gas comprises oxygen and a gas selected from a group consisting of nitrogen, hydrogen, argon, helium, xenon, neon, and any combination thereof.

31. The method of claim 29, wherein the additive gas is selected from a group consisting of $C_xH_yF_z$, $CF_4$, $NH_3$ and $NF_3$.

32. The method of claim 29, wherein the chamber pressure is at about 10 to about 500 mTorr.

33. The method of claim 29, wherein the chamber pressure is at about 150 to about 300 mTorr.

34. The method of claim 29, wherein the oxygen is supplied at a rate of about 5 to about 5000 sccm per wafer.

35. The method of claim 29, wherein the downstream plasma source has an output power of up to about 3000W per wafer.

36. The method of claim 29, wherein the direct plasma source has an output power of up to about 3000W per wafer.

* * * * *

UNITED STATES PATENT AND TRADEMARK OFFICE
CERTIFICATE OF CORRECTION

PATENT NO. : 6,693,043 B1
DATED : February 17, 2004
INVENTOR(S) : Chen et al.

Page 1 of 1

It is certified that error appears in the above-identified patent and that said Letters Patent is hereby corrected as shown below:

<u>Title page,</u>
Item [75], Inventors, add -- Victor A. Markov --.

Signed and Sealed this

Fourteenth Day of March, 2006

JON W. DUDAS
*Director of the United States Patent and Trademark Office*